US010475932B2

United States Patent
Wu et al.

(10) Patent No.: US 10,475,932 B2
(45) Date of Patent: Nov. 12, 2019

(54) TRANSISTOR STRUCTURE AND METHOD FOR FABRICATING THE SAME

(71) Applicant: United Microelectronics Corp., Hsinchu (TW)

(72) Inventors: Shao-Hui Wu, Singapore (SG); Yu-Cheng Tung, Kaohsiung (TW)

(73) Assignee: Untied Microelectronics Corp., Hsinchu (TW)

( * ) Notice: Subject to any disclaimer, the term of this patent is extended or adjusted under 35 U.S.C. 154(b) by 0 days.

(21) Appl. No.: 15/828,060

(22) Filed: Nov. 30, 2017

(65) Prior Publication Data

US 2019/0131456 A1 May 2, 2019

(30) Foreign Application Priority Data

Oct. 30, 2017 (TW) .............................. 106137462 A

(51) Int. Cl.
| | |
|---|---|
| *H01L 29/786* | (2006.01) |
| *H01L 29/10* | (2006.01) |
| *H01L 29/78* | (2006.01) |
| *H01L 27/092* | (2006.01) |
| *H01L 21/8238* | (2006.01) |
| *H01L 29/66* | (2006.01) |
| *H01L 21/8258* | (2006.01) |

(52) U.S. Cl.
CPC ...... *H01L 29/7869* (2013.01); *H01L 21/8238* (2013.01); *H01L 21/8258* (2013.01); *H01L 27/0922* (2013.01); *H01L 29/1033* (2013.01); *H01L 29/66795* (2013.01); *H01L 29/66969* (2013.01); *H01L 29/7832* (2013.01); *H01L 29/7856* (2013.01); *H01L 29/78606* (2013.01); *H01L 29/78648* (2013.01); *H01L 29/78696* (2013.01)

(58) Field of Classification Search
CPC ..... H01L 43/08; H01L 51/56; H01L 51/5072; H01L 51/0072; H01L 43/10
USPC .................................................. 257/43, 288
See application file for complete search history.

(56) References Cited

U.S. PATENT DOCUMENTS

| | | | |
|---|---|---|---|
| 9,006,736 B2 | 4/2015 | Sasagawa | |
| 9,559,215 B1 | 1/2017 | Ahmed et al. | |
| 2015/0001534 A1 | 1/2015 | Chang | |
| 2015/0144942 A1* | 5/2015 | Yang | H01L 29/78696 257/43 |
| 2015/0179801 A1 | 6/2015 | Yamazaki | |
| 2015/0179803 A1 | 6/2015 | Yamazaki | |

* cited by examiner

*Primary Examiner* — Andy Huynh
(74) *Attorney, Agent, or Firm* — J.C. Patents

(57) ABSTRACT

A transistor structure includes a first oxide semiconductor layer, a source structure and a drain structure, and a second oxide semiconductor layer. The first oxide semiconductor layer is doped with sulfur. The source structure and the drain structure are disposed on the first oxide semiconductor layer, and a region of the first oxide semiconductor layer between the source structure and the drain structure forms a channel region. The second oxide semiconductor layer doped with sulfur is at least formed on the channel region of the first oxide semiconductor layer.

18 Claims, 3 Drawing Sheets

TRANSISTOR STRUCTURE AND METHOD FOR FABRICATING THE SAME

CROSS-REFERENCE TO RELATED APPLICATION

This application claims the priority benefit of Taiwan patent application serial no. 106137462, filed on Oct. 30, 2017. The entirety of the above-mentioned patent application is hereby incorporated by reference herein and made a part of the specification.

BACKGROUND OF THE INVENTION

1. Field of the Invention

The invention relates to a semiconductor manufacturing technology. More particularly, the invention relates to a transistor structure and a method for fabricating the same.

2. Description of Related Art

In an integrated circuit of a semiconductor, field effect transistors are main components. The integrated circuit includes a great number of transistors, and performance and size of the transistors affect the overall performance and size of the integrated circuit.

A conventional field effect transistor having a silicon substrate as a base has a metal-oxide-semiconductor (MOS) structure, which includes a gate structure as well as a source region and a drain region on both sides of the gate structure and in the substrate. A channel region is between the source region and the drain region. In addition, the design of a thin film transistor may not need the silicon substrate as a base, but the channel region is still made of a silicon semiconductor.

According to research and development of semiconductor materials, the channel region of the field effect transistor may be replaced with an oxide semiconductor (OS), so that the transistor may be manufactured more easily. The performance of the channel region of the transistor made of the OS may depend on the quality of the oxide semiconductor layer.

Improving the quality of the channel region of the oxide semiconductor layer may allow the improvement of the quality of the transistor made of the OS.

SUMMARY OF THE INVENTION

The invention relates to a transistor structure and a method for fabricating the same. A channel region of the transistor structure is made of a plurality of oxide semiconductor layers doped with sulfur, which improves the quality of the channel region and further improves the quality of the transistor.

In an embodiment of the invention, a transistor structure that includes a first oxide semiconductor layer doped with sulfur, a source structure and a drain structure disposed on the first oxide semiconductor layer, and a second oxide semiconductor layer doped with sulfur is provided. A region of the first oxide semiconductor layer between the source structure and the drain structure forms a channel region. The second oxide semiconductor layer doped with sulfur is at least disposed on the channel region of the first oxide semiconductor layer.

In an embodiment of the invention, the transistor structure further includes a gate insulation layer and a gate structure. The gate insulation layer is disposed on the second oxide semiconductor layer or the first oxide semiconductor layer, and the gate structure is disposed on the gate insulation layer and located between the source structure and the drain structure.

In the transistor structure provided in an embodiment of the invention, a first sulfur concentration of the first oxide semiconductor layer is different from a second sulfur concentration of the second oxide semiconductor layer.

In the transistor structure provided in an embodiment of the invention, a first thickness of the first oxide semiconductor layer is greater than a second thickness of the second oxide semiconductor layer.

In the transistor structure provided in an embodiment of the invention, materials of the first oxide semiconductor layer and the second oxide semiconductor layer include In—Ga—Zn—O (IGZO), In—Zn—O (IZO), In—Ga—O (IGO), Zn—Sn—O (ZTO), In—Sn—Zn—O (ITZO), Hf—In—Zn—O (HIZO), Al—Zn—Sn—O (AZTO), Al—Zn—O (AZO), Ga—Zn—O (GZO), or Zn—O (ZO).

In the transistor structure provided in an embodiment of the invention, the second oxide semiconductor layer includes a portion disposed on the source structure and the drain structure.

In the transistor structure provided in an embodiment of the invention, each of the source structure and the drain structure includes: a metal layer and a metal oxide layer. The metal layer is disposed on the first oxide semiconductor layer, and the metal oxide layer is disposed on a top of the metal layer.

In an embodiment of the invention, the transistor structure further includes a base oxide semiconductor layer on the first oxide semiconductor layer and on an opposite side of the second oxide semiconductor layer.

In the transistor structure provided in an embodiment of the invention, the second oxide semiconductor layer covers the source structure, the drain structure, and the channel region of the first oxide semiconductor layer. The transistor structure further includes a first gate insulation layer and a first gate structure. The first gate insulation layer is disposed on the second oxide semiconductor layer, and the first gate structure is disposed on the first gate insulation layer, has a bottom area, and is located between the source structure and the drain structure.

In the transistor structure provided in an embodiment of the invention, the transistor structure further includes a second gate insulation layer and a second gate structure. The second gate insulation layer covers the first oxide semiconductor layer and is located on an opposite side of the second oxide semiconductor layer. The second gate structure is disposed on the second gate insulation layer.

In an embodiment of the invention, a fabricating method of a transistor structure is provided. The fabricating method includes providing a structural substrate that has a first oxide semiconductor layer doped with sulfur. A source structure and a drain structure are formed on the first oxide semiconductor layer, wherein a channel region of the first oxide semiconductor layer between the source structure and the drain structure is exposed. A second oxide semiconductor layer doped with sulfur is at least disposed on the channel region of the first oxide semiconductor layer.

In an embodiment of the invention, the fabricating method further includes forming a gate insulation layer on the second oxide semiconductor layer or on the first oxide semiconductor layer. A gate structure is formed on the gate insulation layer and between the source structure and the drain structure.

In the fabricating method of the transistor provided in an embodiment of the invention, a first sulfur concentration of the first oxide semiconductor layer is different from a second sulfur concentration of the second oxide semiconductor layer.

In the fabricating method of the transistor provided in an embodiment of the invention, a first thickness of the first oxide semiconductor layer is greater than a second thickness of the second oxide semiconductor layer.

In the fabricating method of the transistor provided in an embodiment of the invention, materials of the first oxide semiconductor layer and the second oxide semiconductor layer include In—Ga—Zn—O (IGZO), In—Zn—O (IZO), In—Ga—O (IGO), Zn—Sn—O (ZTO), In—Sn—Zn—O (ITZO), Hf—In—Zn—O (HIZO), Al—Zn—Sn—O (AZTO), Al—Zn—O (AZO), Ga—Zn—O (GZO), or Zn—O (ZO).

In the fabricating method of the transistor provided in an embodiment of the invention, the second oxide semiconductor layer includes a portion disposed on the source structure and the drain structure.

In an embodiment of the invention, in each of the source structure and the drain structure, the fabricating method further includes: forming a metal layer on the first oxide semiconductor layer and forming a metal oxide layer on a top of the metal layer.

In an embodiment of the invention, the fabricating method further includes forming a base oxide semiconductor layer on the first oxide semiconductor layer and on an opposite side of the second oxide semiconductor layer.

In the fabricating method of the transistor provided in an embodiment of the invention, the second oxide semiconductor layer covers the source structure, the drain structure, and the channel region of the first oxide semiconductor layer, wherein the fabricating method further includes: forming a top gate insulation layer on the first oxide semiconductor layer and forming a top gate structure on the top gate insulation layer. The top gate structure has a bottom area and is located between the source structure and the drain structure.

In the fabricating method of the transistor provided in an embodiment of the invention, the step of providing the structural substrate includes forming a bottom gate structure on a substrate, forming a bottom gate insulation layer that covers the substrate and the bottom gate structure, and forming the first oxide semiconductor layer that covers the bottom gate insulation layer.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

With the research and development of transistor structures and semiconductor materials, a channel region of a thin film transistor may be made of an oxide semiconductor, thereby at least simplifying a manufacturing process of the transistor.

According to the current research and development, a common material of the oxide semiconductor is In—Ga—Zn—O (IGZO), In—Zn—O (IZO), In—Ga—O (IGO), Zn—Sn—O (ZTO), In—Sn—Zn—O (ITZO), Hf—In—Zn—O (HIZO), Al—Zn—Sn—O (AZTO), Al—Zn—O (AZO), Ga—Zn—O (GZO), Zn—O (ZO), or the like. These materials have the properties of semiconductors and may form the channel region of the transistor in replacement of metal semiconductors.

Further, according to the research and development of the oxide semiconductor, doping the oxide semiconductor with sulfur may improve the performance of the semiconductor, and a channel efficacy of the transistor may be improved as well. In an embodiment of the invention, the oxide semiconductor doped with sulfur is adopted to form the channel region of the transistor, and the channel region is constituted by a plurality of oxide semiconductor layers doped with sulfur.

Several embodiments are described below to elaborate the invention, but the invention is not limited to these embodiments. Appropriate combinations of these embodiments, thereby constituting other embodiments, are also permitted.

Figure 1:
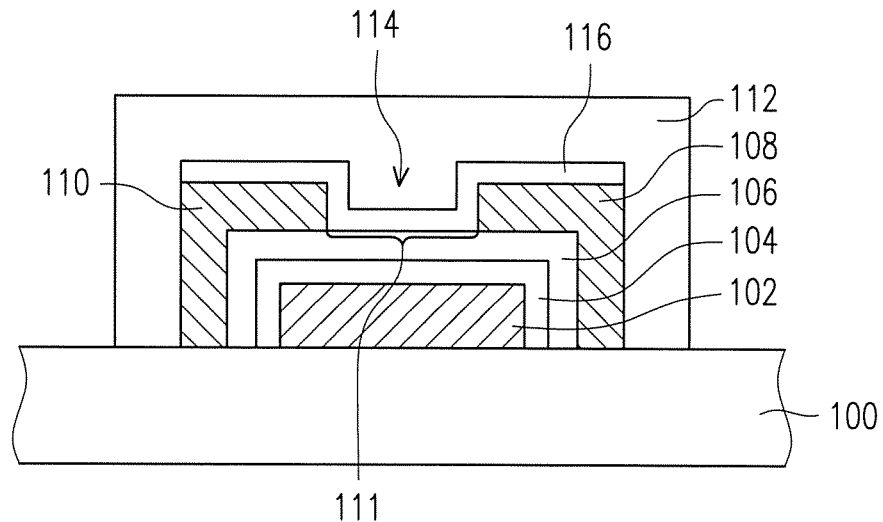
FIG. 1 is a schematic cross-sectional view of a transistor according to an embodiment of the invention.

FIG. 1 is a schematic cross-sectional view of a transistor according to an embodiment of the invention. Referring to FIG. 1, the thin film transistor is illustrated as an example and has a single-gate structure. A gate structure 102 is formed on a substrate 100. A gate insulation layer 104 is formed on the gate structure 102. An oxide semiconductor layer 106 is formed on the gate insulation layer 104. A source structure 110 and a drain structure 108 are formed on both ends of the oxide semiconductor layer 106. It is generally known that the source structure 110 and the drain structure 108 are determined according to an actual circuit operation, so the source structure 110 and the drain structure 108 generally have the same structure and are interchangeable. In this embodiment, the oxide semiconductor layer 106 is doped with sulfur. A region of the oxide semiconductor layer 106 between the source structure 110 and the drain structure 108 is a channel region 111 of the transistor. Since the source structure 110 and the drain structure 108 do not completely cover the oxide semiconductor layer 106, and a position of the channel region 111 that corresponds to an open space 114 between the source structure 110 and the drain structure 108 is exposed in the current manufacturing step, defects may exist on the exposed surface. In an embodiment of the invention, another oxide semiconductor layer 116 doped with sulfur is further formed, a portion of which at least covers the region of the oxide semiconductor layer 106 that corresponds to the channel region 111 and that is exposed by the source structure 110 and the drain structure 108. The oxide semiconductor layer 116 may repair the defects of the oxide semiconductor layer 106 on the channel region 111. In addition, the oxide semiconductor layer 116 may also extend to cover surfaces of the source structure 110 and the drain structure 108. After that, a passivation layer 112 is formed over the source structure 110 and the drain structure 108 to protect the transistor.

In addition, a sulfur concentration of the oxide semiconductor layer 106 and a sulfur concentration of the oxide semiconductor layer 116 are different, but a metal atom composition may be the same. In an exemplary oxide semiconductor made of IGZO, an atomic ratio of In/Ga/Zn is, for example, 4/3/2.

In the embodiment depicted in FIG. 1, the oxide semiconductor layers 106 and 116 doped with sulfur are adopted to improve the quality of the channel region 111. However, the invention is not limited to the transistor structure shown in FIG. 1. Several embodiments are further provided below to illustrate the technology of the invention.

Figure 2:
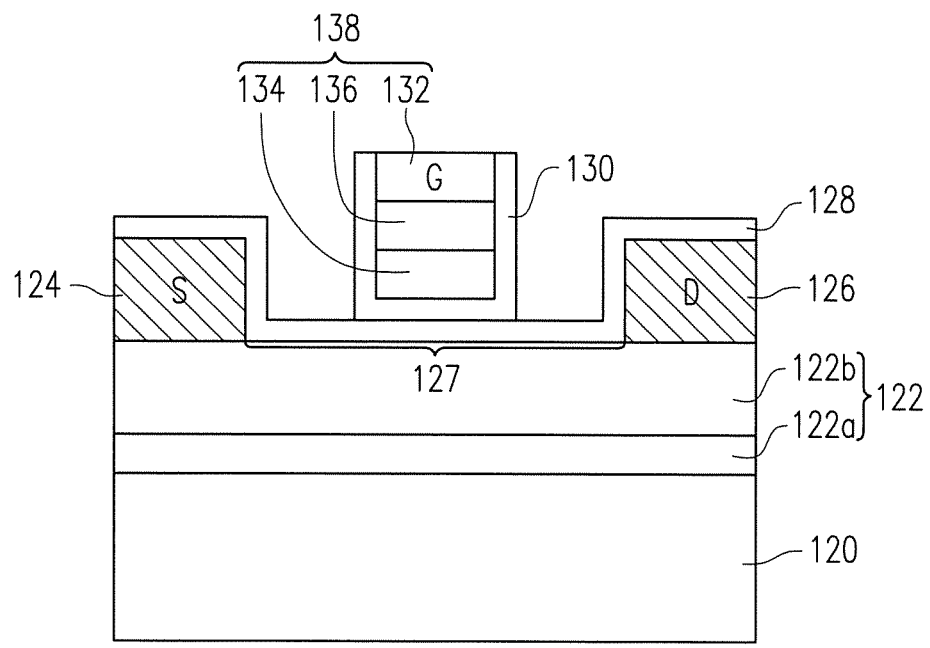
FIG. 2 is a schematic cross-sectional view of a transistor according to an embodiment of the invention.

FIG. 2 is a schematic cross-sectional view of a transistor according to an embodiment of the invention. As shown in FIG. 2, the single-gate transistor structure may have different structural designs. For example, a base oxide semiconductor layer 122a may be first formed on a substrate 120. The base oxide semiconductor layer 122a may or may not be doped with sulfur. The base oxide semiconductor layer 122a achieves a transition effect between the substrate 120 and an oxide semiconductor layer 122b doped with sulfur, thereby allowing the oxide semiconductor layer 122b to be formed more easily. In practice, the base oxide semiconductor layer 122a may also be omitted. As a whole, the base oxide semiconductor layer 122a and the oxide semiconductor layer 122b may be regarded as an oxide semiconductor layer 122 doped with sulfur.

A source structure 124 and a drain structure 126 are formed on both ends of the oxide semiconductor layer 122. The space between the source structure 124 and the drain structure 126 allows a channel region 127 to be formed by the oxide semiconductor layer 122 on a region corresponding to this space.

Another oxide semiconductor layer 128 doped with sulfur then covers the source structure (S) 124 and the drain structure (D) 126 as well as the exposed region of the oxide semiconductor layer 122. Here, the oxide semiconductor layer 128 at least covers the exposed region of the oxide semiconductor layer 122, so that a surface of the oxide semiconductor layer 122 between the source structure 124 and the drain structure 126 may be repaired. In addition, the oxide semiconductor layer 128 may also extend to surfaces of the source structure 124 and the drain structure 126. In addition, the source structure 124 and the drain structure 126 may be, for example, made of a normal conductive material, e.g., metal nitride or TaN.

Through a semiconductor manufacturing process, a gate insulation layer 130 may be a U-shaped insulation layer, for example. In this embodiment, a gate structure (G) 138 is formed within a central space of the U-shaped insulation layer, the bottom and sidewalls of the U-shaped insulation layer are covered by the gate insulation layer 130, and the top of the U-shaped insulation layer is not covered by the gate insulation layer 130. The gate structure 138 may be a single-layer structure or a stacked-layer structure. In the present embodiment, three stacked layers including a bottom metal layer 136, a ferroelectrics layer 134, and a top metal layer 132 is taken for example. A material of the ferroelectrics layer 134 may be, for example, lead zirconate titanate (PZT) or barium strontium titanate (BST). The gate structure 138 and the gate insulation layer 130 described herein are not limited to the illustrated embodiments.

Figure 3:
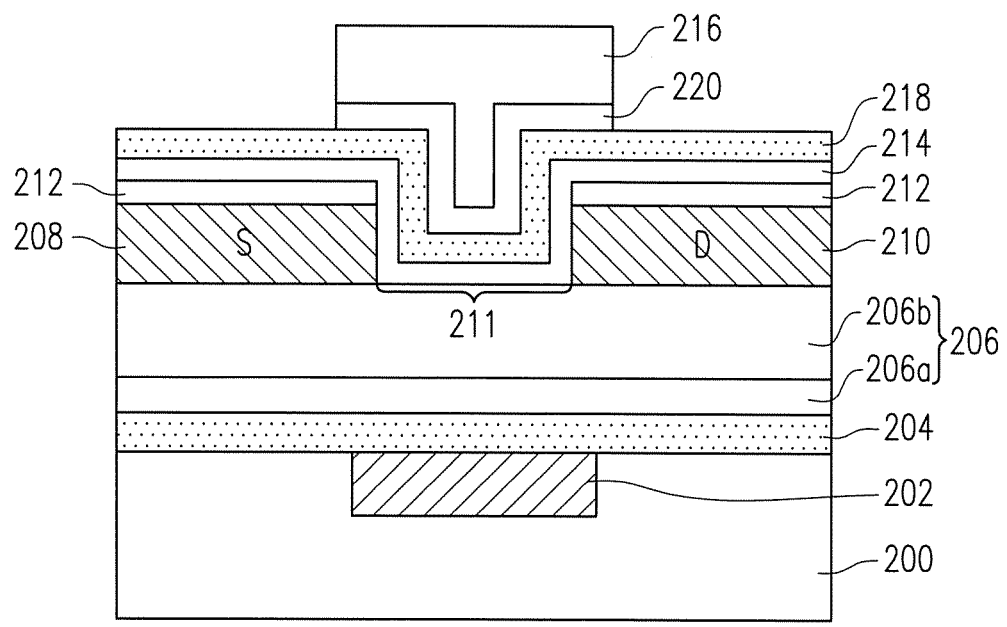
FIG. 3 is a schematic cross-sectional view of a transistor according to an embodiment of the invention.

In an embodiment of the invention, the multi-layered oxide semiconductors doped with sulfur constitute the channel region 127, so as to improve the performance of the channel region 127. This technical feature may be widely applied to a variety of transistors. For example, the channel region may also be applied to a dual-gate transistor. FIG. 3 is a schematic cross-sectional view of a transistor according to an embodiment of the invention.

With reference to FIG. 3, a dual-gate transistor structure is illustrated according to the present embodiment. A back gate structure 202 is first formed on a substrate 200. Then, a back gate insulation layer 204 is formed on the back gate structure 202. The back gate insulation layer 204 may also simultaneously cover other exposed surfaces of the substrate 200. An oxide semiconductor layer 206 doped with sulfur is formed on the back gate insulation layer 204. Here, the oxide semiconductor layer 206 doped with sulfur includes an oxide semiconductor layer 206b which serves as a main portion of a channel region 211. In addition, if needed, the oxide semiconductor layer 206 doped with sulfur may further include an oxide semiconductor layer 206a formed on the back gate insulation layer 204 and acting as a transition layer between the back gate insulation layer 204 and the oxide semiconductor layer 206b, so as to facilitate subsequent formation of the oxide semiconductor layer 206b. The oxide semiconductor layer 206a may or may not be doped with sulfur. In an exemplary IGZO oxide semiconductor, the atomic ratio of In/Ga/Zn of the oxide semiconductor layer 206a is, for example, 1/3/2. In other words, the oxide semiconductor layer 206a may be an optional component and may be ignored. In an exemplary IGZO oxide semiconductor layer 206b, the atomic ratio of In/Ga/Zn of the oxide semiconductor layer 206b is 4/3/2, which is different from the atomic ratio of the oxide semiconductor layer 206a.

A source structure (S) 208 and a drain structure (D) 210 are formed on the oxide semiconductor layer 206. A region of the oxide semiconductor layer 206 between the source structure 208 and the drain structure 210 constitutes a channel region 211. In an embodiment of the invention, another oxide semiconductor layer 214 doped with sulfur that at least covers the channel region 211 of the oxide semiconductor layer 206 is further formed. In addition, a metal oxide layer 212 may be further formed on top surfaces of the source structure 208 and the drain structure 210, but the metal oxide layer 212 is not a necessary component.

In an embodiment of the invention, another oxide semiconductor layer 214 doped with sulfur is at least formed on the oxide semiconductor layer 206b and on an exposed surface of the channel region 211 between the source structure 208 and the drain structure 210. The oxide semiconductor layer 214 also constitutes the channel region 211. The oxide semiconductor layer 214, for example, may repair defects of the exposed surface of the channel region 211 and enhance the performance of the channel region 211. In an embodiment, the oxide semiconductor layer 214 may further extend to cover the source structure 208 and the drain structure 210. In an embodiment, the sulfur concentration of the oxide semiconductor layer 214 and the sulfur concentration of the oxide semiconductor layer 206 (206a) may be different.

In the present embodiment, the dual-gate transistor structure is taken for example, and therefore another gate insulation layer 218 is formed on the oxide semiconductor layer 214. Next, a gate structure 216 is formed on the gate insulation layer 218, wherein the gate structure 216 may be the stacked-layer structure and may, for instance, include a barrier layer 220 based on actual needs. The gate structure 216 of the invention may be of other designs and generally need not be limited to any specific structure. The gate structure 216 may also be referred to as a front gate structure 216 relative to the back gate structure 202.

Figure 4:
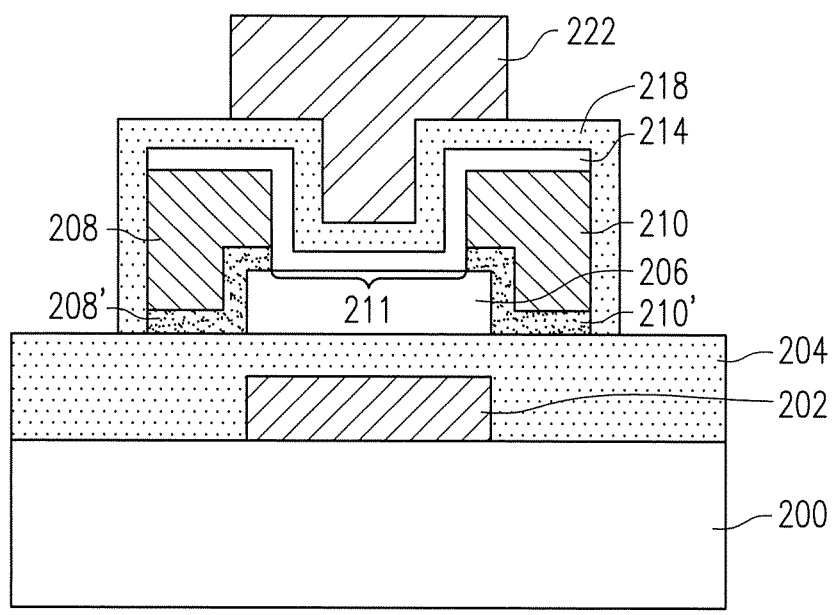
FIG. 4 is a schematic cross-sectional view of a transistor according to an embodiment of the invention.

The dual-gate transistor structure depicted in FIG. 3 may be modified, i.e., the invention may also be applied to other dual-gate transistors. FIG. 4 is a schematic cross-sectional view of a transistor according to an embodiment of the invention.

Referring to FIG. 4, the back gate structure 202 is first formed on the substrate 200. The gate insulation layer 204 is then formed on the substrate 200 and covers the back gate structure 202. The oxide semiconductor layer 206 doped with sulfur is formed on the gate insulation layer 204. The source structure 208 and the drain structure 210 are formed on both ends of the oxide semiconductor layer 206. Based on actual needs, bottoms of the source structure 208 and the drain structure 210 may also include anti-oxidation layers 208' and 210', but the invention is not limited to the exemplified embodiments.

According to an embodiment of the invention, another oxide semiconductor layer 214 is at least formed on the oxide semiconductor layer 206 and on a surface of the corresponding channel region 211 between the source structure 208 and the drain structure 210. As described above, the oxide semiconductor layer 214 is also doped with sulfur, but the sulfur concentration of the oxide semiconductor layer 214 and the sulfur concentration of the oxide semiconductor layer 206 may be different. The oxide semiconductor layer 214 may also extend to cover the source structure 208 and the drain structure 210.

The gate insulation layer 218 is then formed on the oxide semiconductor layer 214. Another gate structure 222 is formed on the gate insulation layer 218, and a bottom of the gate structure 222 is located above the channel region 211 between the source structure 208 and the drain structure 210. The gate structure 222 may be the single-layer structure or the stacked-layer structure; the invention is not limited thereto.

Figure 5:
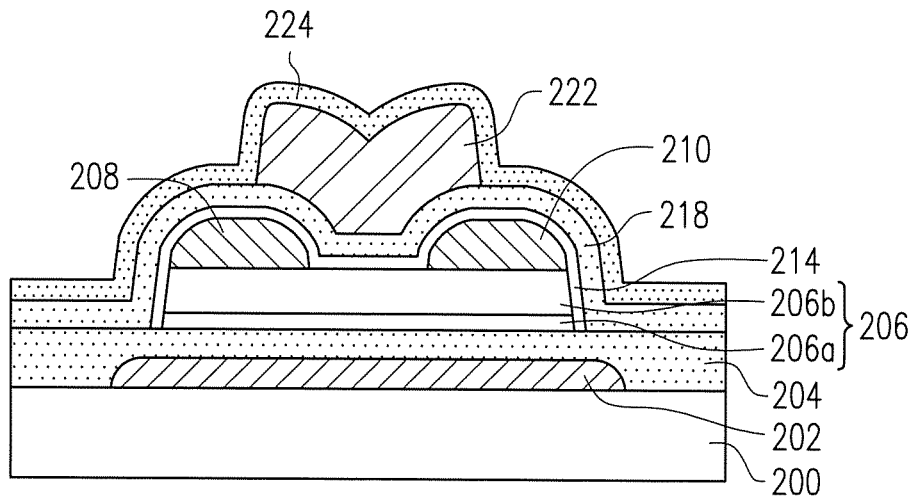
FIG. 5 is a schematic cross-sectional view of a transistor according to an embodiment of the invention.

In another embodiment, another structure of the dual-gate transistor is provided. FIG. 5 is a schematic cross-sectional view of a transistor according to an embodiment of the invention. As shown in FIG. 5, the back gate structure 202 is first formed on the substrate 200. The gate insulation layer 204 is then formed on the substrate 200 and covers the back gate structure 202. The oxide semiconductor layer 206 doped with sulfur is formed on the gate insulation layer 204. The source structure 208 and the drain structure 210 are formed on both ends of the oxide semiconductor layer 206.

According to an embodiment of the invention, another oxide semiconductor layer 214 is at least formed on the oxide semiconductor layer 206 and on the surface of the corresponding channel region 211 between the source structure 208 and the drain structure 210. In the embodiment, the oxide semiconductor layer 214 may also extend to cover the source structure 208 and the drain structure 210 and further extend to an outer side of the oxide semiconductor layer 206 and contact the oxide semiconductor layer 206. As described above, the oxide semiconductor layer 214 is also doped with sulfur, but the sulfur concentration of the oxide semiconductor layer 214 and the sulfur concentration of the oxide semiconductor layer 206 may be different. The oxide semiconductor layer 206 mainly includes the oxide semiconductor layer 206b. As provided above, the oxide semiconductor layer 206 may also include the oxide semiconductor layer 206a, which may or may not be doped with sulfur and may achieve the transition effect to facilitate the formation of the oxide semiconductor layer 206b.

After the oxide semiconductor layer 206 is completely formed, the gate insulation layer 218 is formed on the oxide semiconductor layer 214, and a peripheral portion of the gate insulation layer 218 is merged with the gate insulation layer 204 located on the back of the gate insulation layer 218. Another gate structure 222 is formed on the corresponding gate insulation layer 218, and the location of the gate structure 222 is relative to the location of the channel region between the source structure 208 and the drain structure 210. Next, a passivation layer 224 may cover the entire transistor structure to provide protection.

Figure 6:
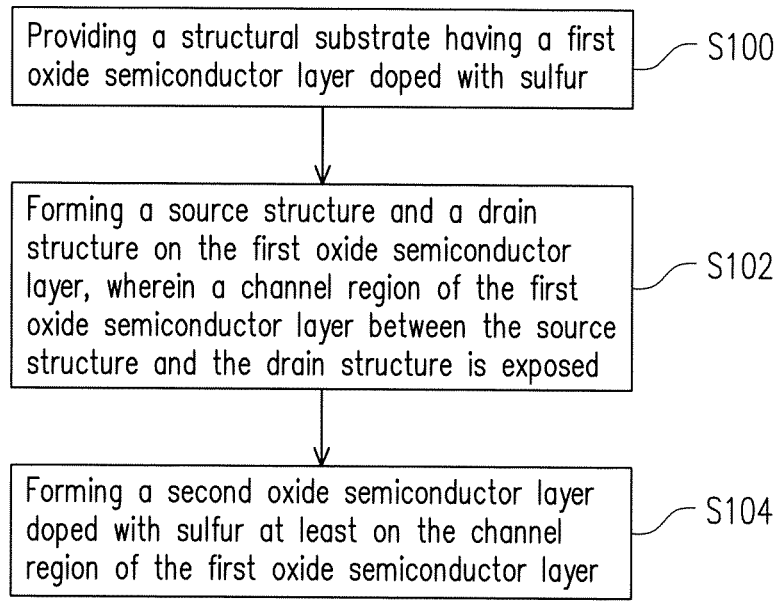
FIG. 6 is a schematic flowchart of a fabricating method of a transistor according to an embodiment of the invention.

In an embodiment of the invention, a fabricating method of a transistor structure is also provided. FIG. 6 is a schematic flowchart of a fabricating method of a transistor according to an embodiment of the invention. In FIG. 6, the fabricating method of the transistor structure in the embodiment is exemplified with reference to the reference numbers depicted in FIG. 3 or FIG. 4. In step S100, a structural substrate (200, 202, 204, and 206) is provided, and the structural substrate has a first oxide semiconductor layer 206 doped with sulfur. In step S102, the source structure 208 and the drain structure 210 are formed on the first oxide semiconductor layer 206, wherein the channel region 211 of the first oxide semiconductor layer 206 between the source structure 208 and the drain structure 210 is exposed. In step S104, a second oxide semiconductor layer 214 doped with sulfur is at least formed on the channel region 211 of the first oxide semiconductor layer 206.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A transistor structure, comprising:
a first oxide semiconductor layer doped with sulfur;
a source structure and a drain structure, disposed on one side of the first oxide semiconductor layer, wherein a region of the first oxide semiconductor layer between the source structure and the drain structure forms a channel region; and
a second oxide semiconductor layer doped with sulfur, at least disposed on the channel region and on the side of the first oxide semiconductor layer,
wherein the second oxide semiconductor layer comprises a portion disposed directly on the source structure and the drain structure or directly on the source structure and further extending toward an outer side of the source structure and the drain structure and contacting the first oxide semiconductor layer.

2. The transistor structure of claim 1, further comprising:
a gate insulation layer, disposed on the second oxide semiconductor layer or the first oxide semiconductor layer; and
a gate structure, disposed on the gate insulation layer and located between the source structure and the drain structure.

3. The transistor structure of claim 1, wherein a first sulfur concentration of the first oxide semiconductor layer is different from a second sulfur concentration of the second oxide semiconductor layer.

4. The transistor structure of claim 1, wherein a first thickness of the first oxide semiconductor layer is greater than a second thickness of the second oxide semiconductor layer.

5. The transistor structure of claim 1, wherein materials of the first oxide semiconductor layer and the second oxide semiconductor layer comprise In—Ga—Zn—O (IGZO), In—Zn—O (IZO), In—Ga—O (IGO), Zn—Sn—O (ZTO), In—Sn—Zn—O (ITZO), Hf—In—Zn—O (HIZO), Al—Zn—Sn—O (AZTO), Al—Zn—O (AZO), Ga—Zn—O (GZO), or Zn—O (ZO).

6. The transistor structure of claim 1, wherein each of the source structure and the drain structure comprises:
a metal layer, disposed on the first oxide semiconductor layer; and
a metal oxide layer, disposed on a top of the metal layer.

7. The transistor structure of claim 1, further comprising a base oxide semiconductor layer on the first oxide semiconductor layer and on an opposite side of the second oxide semiconductor layer.

8. The transistor structure of claim 1, wherein the second oxide semiconductor layer covers the source structure, the drain structure, and the channel region of the first oxide semiconductor layer, wherein the transistor structure further comprises:
a first gate insulation layer, disposed on the second oxide semiconductor layer; and
a first gate structure disposed on the first gate insulation layer, having a bottom area, and located between the source structure and the drain structure.

9. The transistor structure of claim 8, further comprising:
a second gate insulation layer, covering the first oxide semiconductor layer and located on an opposite side of the second oxide semiconductor layer; and
a second gate structure, disposed on the second gate insulation layer.

10. A fabricating method of a transistor structure, comprising:
providing a structural substrate having a first oxide semiconductor layer doped with sulfur;
forming a source structure and a drain structure on one side of the first oxide semiconductor layer, wherein a channel region of the first oxide semiconductor layer between the source structure and the drain structure is exposed; and
forming a second oxide semiconductor layer doped with sulfur and at least disposed on the channel region and on the side of the first oxide semiconductor layer,
wherein the second oxide semiconductor layer comprises a portion disposed directly on the source structure and the drain structure.

11. The fabricating method of the transistor structure of claim 10, further comprising:
forming a gate insulation layer on the second oxide semiconductor layer or on the first oxide semiconductor layer; and
forming a gate structure on the gate insulation layer and between the source structure and the drain structure.

12. The fabricating method of the transistor structure of claim 10, wherein a first sulfur concentration of the first oxide semiconductor layer is different from a second sulfur concentration of the second oxide semiconductor layer.

13. The fabricating method of the transistor structure of claim 10, wherein a first thickness of the first oxide semiconductor layer is greater than a second thickness of the second oxide semiconductor layer.

14. The fabricating method of the transistor structure of claim 10, wherein materials of the first oxide semiconductor layer and the second oxide semiconductor layer comprise In—Ga—Zn—O (IGZO), In—Zn—O (IZO), In—Ga—O (IGO), Zn—Sn—O (ZTO), In—Sn—Zn—O (ITZO), Hf—In—Zn—O (HIZO), Al—Zn—Sn—O (AZTO), Al—Zn—O (AZO), Ga—Zn—O (GZO), or Zn—O (ZO).

15. The fabricating method of the transistor structure of claim 10, in each of the source structure and the drain structure, the method further comprising:
forming a metal layer on the first oxide semiconductor layer; and
forming a metal oxide layer on a top of the metal layer.

16. The fabricating method of the transistor structure of claim 10, further comprising:
forming a base oxide semiconductor layer on the first oxide semiconductor layer and on an opposite side of the second oxide semiconductor layer.

17. The fabricating method of the transistor structure of claim 10, wherein the second oxide semiconductor layer covers the source structure, the drain structure, and the channel region of the first oxide semiconductor layer, wherein the method further comprises:
forming a top gate insulation layer on the first oxide semiconductor layer; and
forming a top gate structure on the top gate insulation layer, the top gate structure having a bottom area and being located between the source structure and the drain structure.

18. The fabricating method of the transistor structure of claim 17, wherein the step of providing the structural substrate comprises:
forming a bottom gate structure on a substrate;
forming a bottom gate insulation layer, the bottom gate insulation layer covering the substrate and the bottom gate structure; and
forming the first oxide semiconductor layer, the first oxide semiconductor layer covering the bottom gate insulation layer.

* * * * *